US005981393A

United States Patent [19]

Liao et al.

[11] Patent Number: 5,981,393
[45] Date of Patent: Nov. 9, 1999

[54] METHOD OF FORMING ELECTRODES AT THE END SURFACES OF CHIP ARRAY RESISTORS

[75] Inventors: Shih-Chang Liao, Hsin-Chu; Duen-Jen Cheng, Kaohsiung, both of Taiwan

[73] Assignee: Cyntec Co., Ltd., Hsin-Chu, Taiwan

[21] Appl. No.: 08/939,671

[22] Filed: Sep. 29, 1997

[51] Int. Cl.[6] .............................. H01L 21/00; B44C 1/22

[52] U.S. Cl. .............................. 438/691; 216/16; 216/51; 216/52; 216/65; 438/707

[58] Field of Search .............................. 216/14, 16, 41, 216/51, 52, 59, 65, 84; 438/14, 691, 707

[56] References Cited

U.S. PATENT DOCUMENTS 3,890,178 6/1975 Lebailly .............................. 438/753 X
5,693,181 12/1997 Bernstein .............................. 438/753 X

*Primary Examiner*—William Powell
*Attorney, Agent, or Firm*—Bacon & Thomas

[57] ABSTRACT

A method of forming electrode at the end surface of chip array resistors utilizes the vacuum metallization technology such as sputtering evaporating deposition or ion implanting accompanying a metal mask for forming electrode at the end surfaces of chip array resistors. A blank base can be used instead of a punch-through base which has to be used in conventional technology. The method disclosed in the present invention may greatly increase the productivity of the electrodes, and at the same time, the variation of resistance value of the chip array resistor is minimized and the product quality may be improved.

4 Claims, 3 Drawing Sheets

METHOD OF FORMING ELECTRODES AT THE END SURFACES OF CHIP ARRAY RESISTORS

BACKGROUND OF THE INVENTION

1. Field of the Invention

The present invention relates to a method of forming electrodes at the end surfaces of chip array resistors, and more particularly, to a technology of utilizing sputtering deposition with metal mask to form electrodes at the end surfaces of chip resistors without restriction of a punch-through wafer use so that not only producing capability can be promoted but also the quality of the electrodes at the end surfaces of chip array resistors would be maintained effectively.

2. Description of the Prior Art

Generally speaking, forming electrodes at the end surface of chip array resistors is performed in a conventional method by means of coating a metallic gel first, then followed by sintering or baking. However, during the manufacturing process for chip array resistors, frequent sintering under high temperature (in the steps of making thick film for chip array resistors) causes the variation of value of resistance in the resistors after adjusted through a laser trimming. In general, if standard deviation of a resistor's resistance is increased, it results in the decrease of yield rate of production. Moreover, if a metallic gel of baking type is used, the electrodes would be formed on the wafer by deposition of metallic gel whose adhesive force is weaker than that by sintering the metallic gel. No matter what conventional method is used, the standard process would be peeling a wafer in strips and then employing it to form the electrodes either by soaking or by coating. Such processes result in the necessity of employing high cost but unsophisticated punch-through wafer whose size can not be enlarged because of shrinkage caused by sintering. As a result, manufacturing efficiency, product yield rate and quality can not be improved.

The conventional method of forming chip resistance of electrodes at end surfaces of array resistors by sintering after applying an electrically conducting gel with soaking or coating includes the following steps:

1. Printing a punch-through wafer as shown in FIG. 8;
2. Peeling the wafer to form strip-shaped arrays as shown in FIG. 9;
3. Soaking or coating the strip-shaped wafer on the first end of surface (upper Fig.) and then on the second end surface (lower Fig.) as shown in FIG. 10 and 11;
4. Drying the wafer by sintering after being accomplished the step of soaking or coating as shown in FIG. 12;
5. Separating the wafer in pieces as shown in FIG. 13.

1) Features of Soaking or Coating

A punch-through wafer is required in forming electrodes at the end surfaces of chip array resistors, it is performed by opening a hole on a ceramic base mold for isolating a plurality of electrode terminals from one another so that electrical connection between adjacent electrode terminals with conducting metallic gel may be prevented. As the finished wafer in complete figure is employed, the electrodes at the end terminals of the chip array resistors may be easily formed after soaking or coating the metallic gel on the end surfaces of the strip-shaped wafer. Such a conventional method of forming electrodes has merits that it is quite appreciated by most of manufacturers in this field because it is technically simple and compatible to other related technology which they have been well experienced.

2) Disadvantages of Soaking or Coating

In spite of its simplicity in making process, a punch-through-base method which requires forming chip array resistors is still with some restrictions in designing and printing, namely:

A. The Pre-punched holes on the ceramic base will change their size due to shrinking during sintering process. As a result, only specific range of sizes are useful for the manufacturers. For example, the maximum size of ceramic base that suppliers can furnish is 60 mm×45 mm which, in general, is ranked per ±1 mm for each class. Presently a conventional ceramic base is ranked in 40~50 classes so that a manufacturer has to take at least 10~20 different classes of the ceramic base to make up about 429 pieces of 1206 chip array resistors. On the contrary, a 3 square inch commercial base may be used to make more than 1200 pieces of chip array resistors. Difference of productivity between the two cases is so obvious and will be much more significant as the size of the base is now shifting to 4 inch or 4.5 inch larger than ever.

B. As the number of classes of punch-through base ranges up so many from 10 to 20, the mesh patterns used to print the base also have to be increased correspondingly, which entails difficulty for centralization.

C. As the difference between the size of adjacent base classes is so small that it is only ±0.1 mm, the variation of design of resistance patterns or other printing pattern are restricted accordingly, which results in wasting available spaces.

Furthermore, soaking or coating process itself includes several disadvantages. The metallic conductive gel is exposed to the atmosphere during the procedure which causes the change of material viscosity with respect to the time elapsed. In addition, during the drying step arranged to be accomplished before sintering, the tools and equipment for drying and sintering are not allowed to contact the coated surface. Consequently it is difficult to make and handle those tools and equipment.

However, soaking or coating the end surface of chip array resistors is performed after the step of laser trimming of resistance value, value of the product resistance will vary according to the amount of heat applied to the end surfaces of the chip array resistors during sintering. The longer times the product is sintered, the greater the product resistance varies. Accordingly, quality of the product is degraded if it is impossible to control the resistance accurately.

In order to improve the shortcoming concerning the method of forming electrodes at the end surfaces of chip array resistors, through a long term hard study and experiments, the applicant has developed a novel method of forming electrodes at the end surfaces of chip array resistors and now is intended to disclose it hereafter.

SUMMARY OF THE INVENTION

It is a first object of the present invention to provide a method of forming electrodes at the end surface of chip array resistors, wherein, it is released from various restrictions of conventional methods without employing a punch-through base, yet it can easily attain the purpose of forming mutually isolated electrode at the end terminals of the chip array resistors and, moreover, the variation of resistance is minimized for improving the quality of the products and increasing yield rate of production.

It is a second object of the present invention to provide a method of forming. electrodes at the end surfaces of chip array resistors wherein a blank base may be used instead of a punch-through base to greatly increase the productivity yet maintain the stable quality of the electrode at the end surfaces.

To achieve the above described object and other advantages, a method of sputtering is introduced in the present invention to form electrodes at the end surfaces of chip array resistors. The mutual isolation between two adjacent electrodes forms an isolated blank space therebetween, but maintains stability of thin metallic film deposited on the electrodes at the end surfaces. Moreover, the possibility of using a blank base leads to increase the productivity and at the same time, reduce the production cost.

BRIEF DESCRIPTION OF THE DRAWINGS

The accompanying drawings included is to provide a further understanding of the invention and incorporate in and constitute a part of this specification, also to illustrates embodiment of the invention and together with the description served to explain the principles of the invention, wherein.

DETAILED DESCRIPTION OF THE PREFERRED EMBODIMENT

Figure 1:
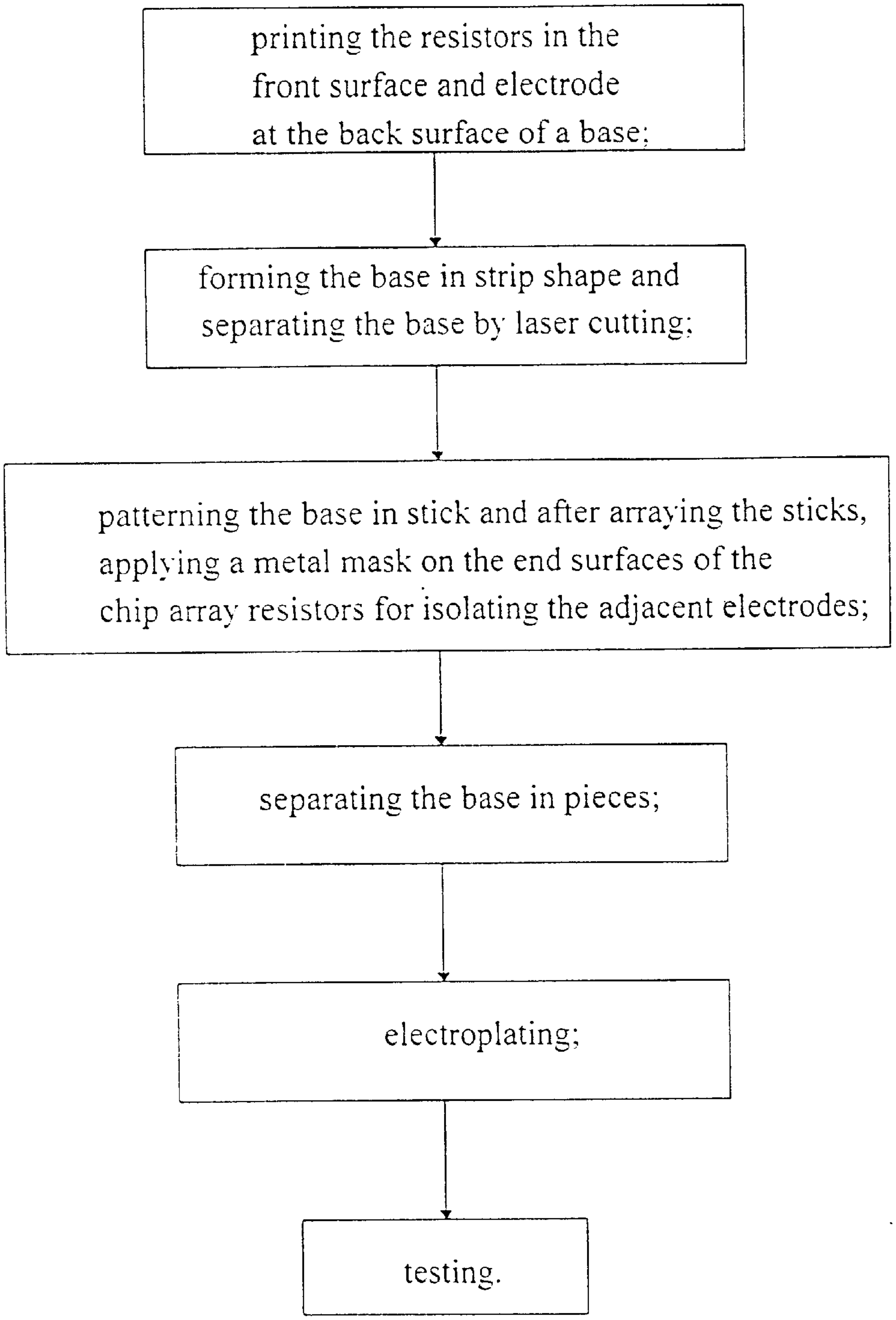
FIG. 1 is a flow chart showing the manufacturing processes of the present invention.
Figure 2:
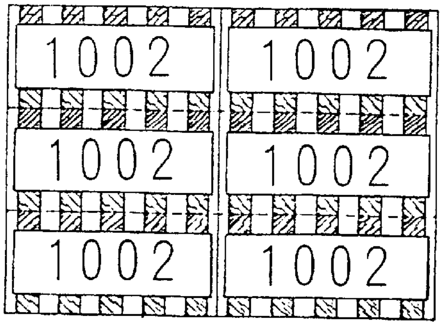
FIG. 2 is a schematic drawing of the present invention showing a base being completed printed and laser cut.
Figure 5:
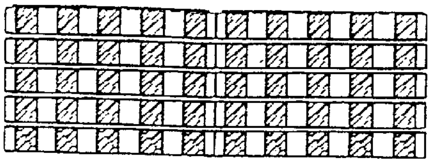
FIG. 5 is a drawing of the present invention showing the state of a base whose end surfaces is deposited a thin film after being sputtered.
Figure 3:
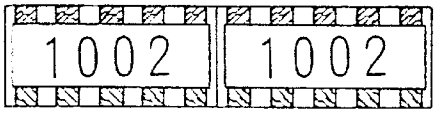
FIG. 3 is a schematic drawing of the present invention showing the base being peeled in strip shape by patterning.
Figure 6:
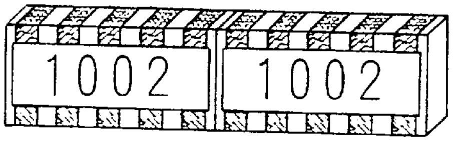
FIG. 6 is a drawing of the present invention showing the state of a base forming in a single stick figure after sputtering on the end surfaces by applying a metal mask.
Figure 4:
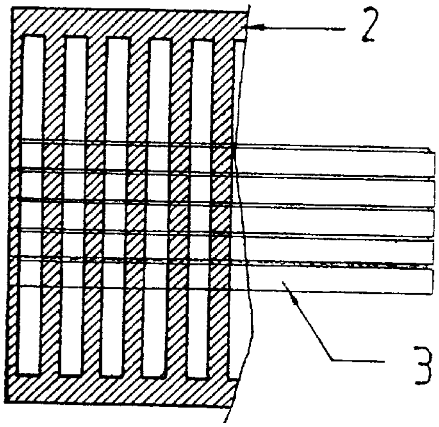
FIG. 4 is a drawing of the present invention illustrating a base being disposed and covered with a metal mask.
Figure 7:
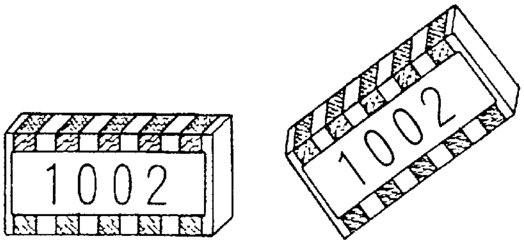
FIG. 7 is a schematic drawing of the present invention showing the base separated in pieces.
Figure 8:
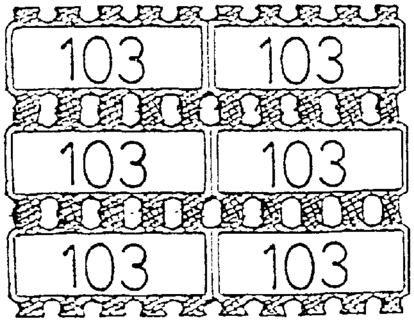
Fig. 8 (PRIOR ART)
FIG. 8 is a drawing of a conventional punch-through base being printed.
Figure 11:
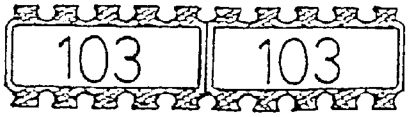
Fig. 11 (PRIOR ART)
FIG. 11 is a drawing illustrating the state of a base after being soaked or coated in strip shape in a conventional making process.
Figure 9:
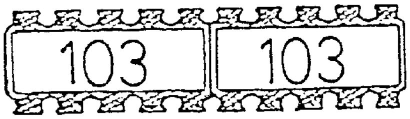
Fig. 9 (PRIOR ART)
FIG. 9 is a drawing illustrating the state of soaking or coating in strip shape in a conventional making process.
Figure 12:
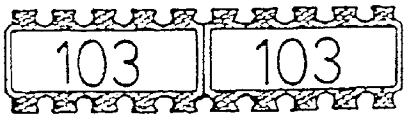
Fig. 12 (PRIOR ART)
FIG. 12 is a drawing illustrating the state of a base being dried and sintered after soaking or coating in strip shape in a conventional making process.
Figure 10:
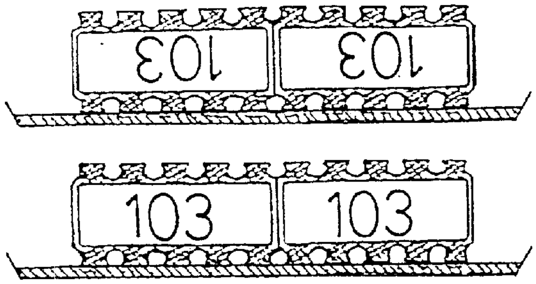
Fig. 10 (PRIOR ART)
FIG. 10 is a drawing illustrating the state of soaking or coating in strip shape in a conventional making process.
Figure 13:
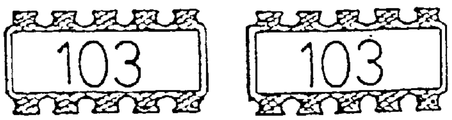
Fig. 13 (PRIOR ART)
FIG. 13 is a drawing showing separating the base in pieces in a conventional making process.

Referring to FIG. 1, a method of forming electrodes at the end surfaces of chip array resistors comprises the steps:

1. accomplishing printing of resistors in the front surface and electrode at the back surface of a base, as shown in FIG. 2;
2. forming the base in strip shape and separating the base by laser cutting as shown in FIG. 2;
3. patterning the base in stick, and after arraying the sticks covering a metal mask on the end surfaces of the chip array resistors for isolating the adjacent electrodes at the end surfaces with a predetermined clearance, as shown in FIG. 3 and 4;
4. depositing a thin metallic film on the end surfaces of the base by sputtering, as shown in FIG. 5 and 6;
5. separating the base in pieces, as shown in FIG. 7;
6. electroplating the products;
7. site testing the products;

In the above described embodiment it is understood that vacuum metallizing technology such as sputtering evaporating or ion implantation can be used to form electrodes at the end surfaces of the chip array resistors. The resistance films of Ni—Cr or Ta2N group chemicals and the electrode films of NiCu are grown on a base material containing 96% aluminum oxide (it may be boron nitride, silicon nitride or silicon carbide). Evaporation parameters are such that the temperature of the base material is controlled at 150–350° C., thickness, 800–3000 A for controlling resistance at 40–1500 Ω/opening and TCR 25–100 ppm. Afterward, various resistors with resistance ranging from 0–300 k Ω, busses of various structures and isolation type resistance networks are formed by means of the procedures of exposing, developing and etching. In order to stabilize their resistances, the chip array resistors after pattering are annealed under the temperature of 300–500° C. in an inert gas as nitrogen. After that the accuracy of the resistance value is adjusted to be within the range of 0.1%~5% by a step of laser trimming. For assuring the resistors to be able to maintain their normal function under all circumstances, the base (i.e. the wafer) whose resistors' resistance value being modified is enclosed in polyime (sintering temperature 200–350° C.) or glass by means of printing process for protection. After the resistance values of the resistors are printed on it, the base is cut by CO2 or YAG laser according to the requirement and chip direction, then followed by separation in strips.

Next, use any metallic or ceramic materials which may be formed into a definite figure as a metal mask for isolating the conductive layer at the end surfaces of the array resistors with appropriate clearance, and then apply a thin conductive film along the side edges of strip-shaped semi-products by means of vacuum evaporation sputtering or coating for connecting the metallic conductive layers. Followed are the steps of separating chips electroplating a Ni layer and a Sn-Pb layer to form finished products of SMD type chip array resistor, afterward the finished product are site tested and packaged.

In the present invention, the vacuum metallization technology such as sputtering, evaporating or ion implanting are utilized accompanying a metal mask for forming electrodes at the end surfaces of chip array resistor, the using of a conventional punch-through base is not required, instead of using a blank base to greatly increase the productivity of the electrodes, and at the same time, the variation of resistance value of the chip array resistors is minimized and the product quality is improved.

It will be apparent to those skilled in the art that the various modification and variation can be made in the method of forming electrodes at the end surfaces of chip array resistors of the present invention without departing from the sprit or scope of the invention. Thus, it is intended that the present invention covers the modifications and variations they come within the scope of the appended claims and their equivalents.

What is claimed is:

1. A method for forming electrodes at end surfaces of chip array resistors which have a base with front and back surfaces and which comprises;

printing the resistors in the front surface and the electrodes at the back surface of the base;

forming the base in strip shape and separating the base by mechanical cutting, patterning with a mask the base on the end surfaces of the chip array resistors for isolating the adjacent electrodes at the end surfaces with a clearance;

depositing a thin metallic film on the end surfaces of the base by sputtering of vacuum metallization so that a thin metallic film may be formed on the unmasked end surfaces;

separating the base in pieces;

electroplating the pieces; and site testing the chip array resistors.

2. A method as claimed in claim 1, wherein said vacuum metallizing process is a sputtering deposition process.

3. A method as claimed in claim 1, wherein the material applied to said resistors may be aluminum oxide, boron nitride, silicon nitride and silicon carbide which may grow into a resistance film of Si—Cr or an electrode film of NiCu.

4. A method as claimed in claim 1, wherein the mask material used for said mask may be metallic or ceramic material.

* * * * *